(12) United States Patent
Mori

(10) Patent No.: US 10,937,715 B2
(45) Date of Patent: Mar. 2, 2021

(54) SUBSTRATE FOR POWER MODULE, COLLECTIVE SUBSTRATE FOR POWER MODULES, AND METHOD FOR MANUFACTURING SUBSTRATE FOR POWER MODULE

(71) Applicants: NGK ELECTRONICS DEVICES, INC., Yamaguchi (JP); NGK INSULATORS, LTD., Aichi (JP)

(72) Inventor: Kiichiro Mori, Yamaguchi (JP)

(73) Assignees: NGK ELECTRONICS DEVICES, INC., Yamaguchi (JP); NGK INSULATORS, LTD., Aichi (JP)

( * ) Notice: Subject to any disclaimer, the term of this patent is extended or adjusted under 35 U.S.C. 154(b) by 465 days.

(21) Appl. No.: 15/821,894

(22) Filed: Nov. 24, 2017

(65) Prior Publication Data

US 2018/0102303 A1 Apr. 12, 2018

Related U.S. Application Data

(63) Continuation of application No. PCT/JP2016/065838, filed on May 27, 2016.

(30) Foreign Application Priority Data

May 27, 2015 (JP) .............................. JP2015-107141

(51) Int. Cl.
*H01L 23/373* (2006.01)
*B32B 15/04* (2006.01)
(Continued)

(52) U.S. Cl.
CPC .......... *H01L 23/3735* (2013.01); *B32B 3/263* (2013.01); *B32B 3/30* (2013.01);
(Continued)

(58) Field of Classification Search
CPC ............... H01L 23/3735; H01L 23/142; H01L 21/4871; B32B 3/263; B32B 3/30;
(Continued)

(56) References Cited

U.S. PATENT DOCUMENTS

2012/0134115 A1 5/2012 Schulz-Harder et al.

FOREIGN PATENT DOCUMENTS

DE 10-2009-033029 A1 1/2011
JP H04-103150 A 4/1992
(Continued)

OTHER PUBLICATIONS

NPL 1 Extended European Search Report issued in European Patent Application No. 16800144.4, dated Jan. 21, 2019 (8 pages).
(Continued)

*Primary Examiner* — Laura A Auer
(74) *Attorney, Agent, or Firm* — Nakanishi IP Associates, LLC

(57) ABSTRACT

A power module substrate allows prompt heat dissipation from a semiconductor device and avoids separation of a ceramic plate and a copper plate at their joint interface and cracks in the ceramic plate. A power module substrate for mounting a semiconductor device includes a ceramic plate, a copper circuit plate on a main surface of the ceramic plate, and a heat dissipation copper plate on a surface of the ceramic plate opposite to the main surface. The copper circuit plate includes at least one first copper circuit plate and at least one second copper circuit plate different from the first circuit board. The first copper circuit plate includes a first portion on which the semiconductor device is mountable, and a second portion outward from the first portion and surrounding the first portion and thinner than the first portion.

4 Claims, 7 Drawing Sheets

(Enlarged longitudinal cross-sectional view taken along line B-B' in Fig. 3A)

(51) Int. Cl.

| | | |
|---|---|---|
| | *B32B 15/20* | (2006.01) |
| | *B32B 18/00* | (2006.01) |
| | *B32B 3/26* | (2006.01) |
| | *B32B 3/30* | (2006.01) |
| | *B32B 7/04* | (2019.01) |
| | *H01L 23/13* | (2006.01) |
| | *H01L 23/14* | (2006.01) |
| | *B32B 37/06* | (2006.01) |
| | *H01L 21/48* | (2006.01) |

(52) U.S. Cl.
CPC ............... *B32B 7/04* (2013.01); *B32B 15/04* (2013.01); *B32B 15/20* (2013.01); *B32B 18/00* (2013.01); *B32B 37/06* (2013.01); *H01L 21/4871* (2013.01); *B32B 2307/202* (2013.01); *B32B 2307/302* (2013.01); *B32B 2311/12* (2013.01); *B32B 2315/02* (2013.01); *B32B 2457/00* (2013.01); *H01L 23/13* (2013.01); *H01L 23/142* (2013.01)

(58) Field of Classification Search
CPC ... B32B 15/04; B32B 15/20; B32B 2307/202; B32B 2307/302; B32B 2311/12; B32B 2457/00
See application file for complete search history.

(56) References Cited

FOREIGN PATENT DOCUMENTS

| | | |
|---|---|---|
| JP | H10-4156 A | 1/1998 |
| JP | H10-242330 A | 9/1998 |
| JP | H10-242331 A | 9/1998 |
| JP | 2006-156994 A | 6/2006 |
| JP | 2007-134563 A | 5/2007 |
| JP | 2008-010520 A | 1/2008 |
| JP | 2008-198905 A | 8/2008 |
| JP | 2012-182279 A | 9/2012 |
| JP | 2012-531728 A | 12/2012 |
| JP | 2014-011423 A | 1/2014 |
| JP | 2015-56616 A | 3/2015 |

OTHER PUBLICATIONS

International Preliminary Report on Patentability (IPRP), dated Nov. 28, 2017, issued in the International Patent Application No. PCT/JP2016/065838 with an English translation (15 pages).
International Search Report issued in International Application No. PCT/JP2016/065838 dated Aug. 16, 2016 and translation thereof (5 pages).
Written Opinion of International Searching Authority issued in International Application No. PCT/JP2016/065838 dated Aug. 16, 2016 (5 pages).

(Enlarged longitudinal cross-sectional view taken along line A-A' in Fig. 1A)

(Enlarged longitudinal cross-sectional view taken along line B-B' in Fig. 3A)

Longitudinal cross-sectional view taken along line C-C' in Fig. 4A

Longitudinal cross-sectional view taken along line D-D' in Fig. 5A

Fig. 6A (First process)
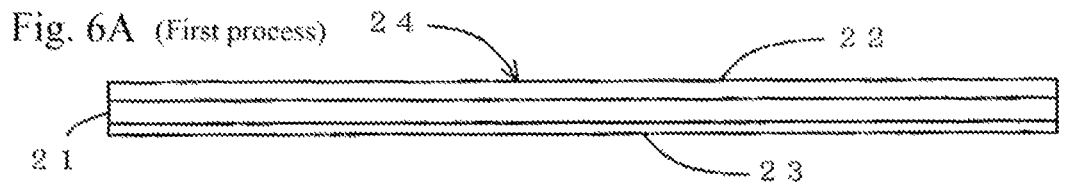
Fig. 6B (Second process)
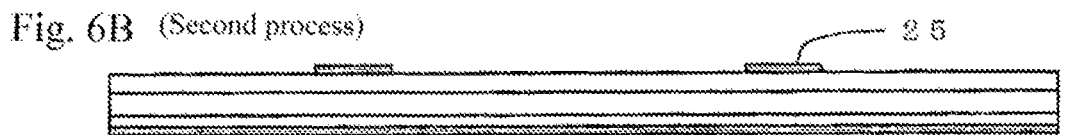
Fig. 6C (Third process) (Etching)
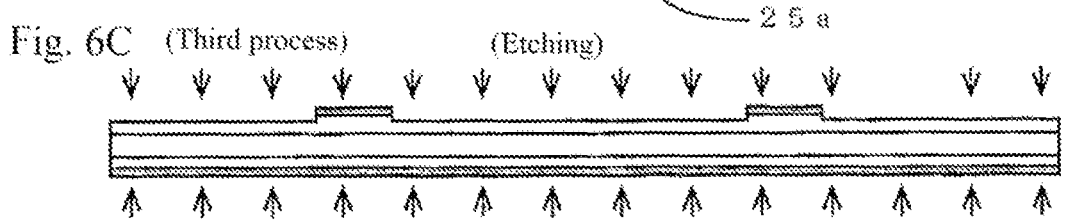
Fig. 6D (Third process)
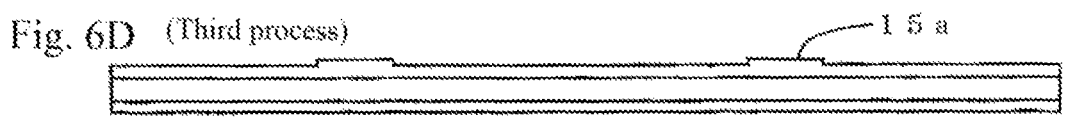
Fig. 6E (Fourth process)
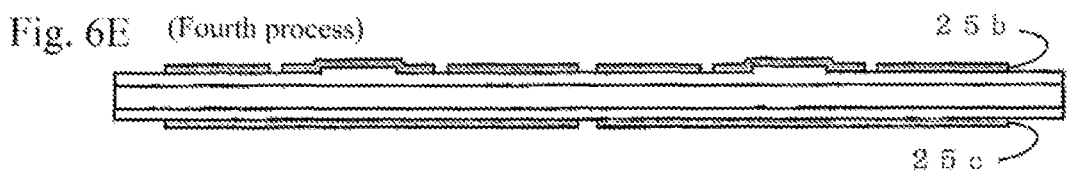
Fig. 6F (Fourth process) (Etching)
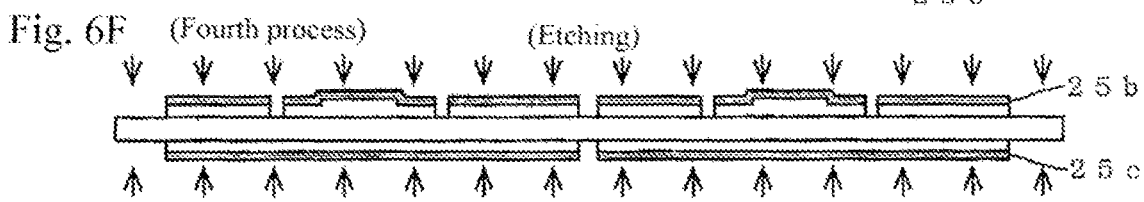
Fig. 6G (Fifth process)
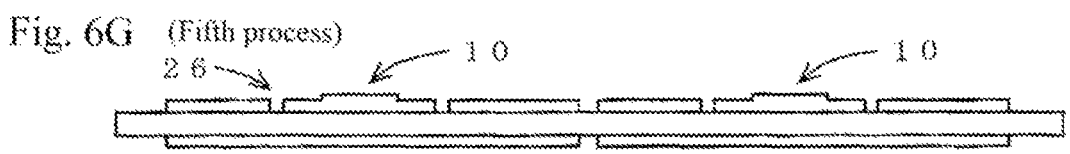
Fig. 6H (Fifth process)
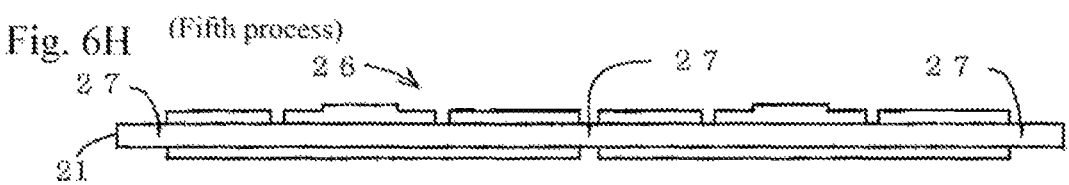
Fig. 6I (Fifth process)
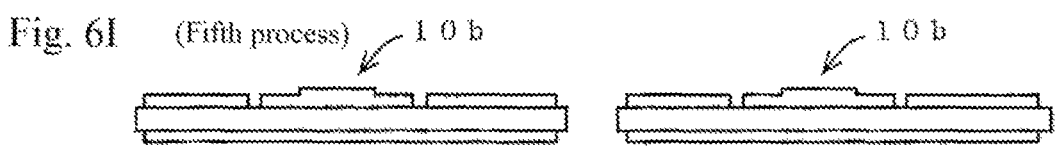

SUBSTRATE FOR POWER MODULE, COLLECTIVE SUBSTRATE FOR POWER MODULES, AND METHOD FOR MANUFACTURING SUBSTRATE FOR POWER MODULE

CROSS-REFERENCE TO RELATED APPLICATIONS

This application is a continuation application of International Patent Application No. PCT/JP2016/065838 filed on May 27, 2016, which claims priority to Japanese Patent Application No. 2015-107141 filed on May 27, 2015, the entire contents of which are incorporated by reference.

BACKGROUND OF INVENTION

Field of the Invention

The present invention relates to a power module substrate, including a ceramic plate and a copper plate joined together for mainly mounting a power semiconductor device, and a collective substrate for power modules, and a method for manufacturing the power module substrate.

Background Art

A substrate for a power module includes a ceramic plate, an island-shaped copper circuit plate arranged on one main surface of the ceramic plate, and a heat dissipation copper plate arranged on the other main surface of the ceramic plate. This power module substrate is used for mounting a power semiconductor device, such as a power integrated circuit (IC) or an insulated gate bipolar transistor (IGBT), or for mounting a passive device, such as a capacitor. Recent power semiconductor devices consume more power, and generate more heat. Substrates for power modules may thus need to have higher heat resistance, heat dissipation, and insulation.

A power module substrate includes a ceramic plate to increase heat resistance and insulation. A power module substrate may also include a joined structure of a copper plate and a ceramic plate to increase heat dissipation. A power module substrate is typically designed to dissipate heat generated from a semiconductor device mounted on its copper circuit plate downward through the copper circuit plate, a ceramic plate, and a heat dissipation copper plate. However, the power module substrate including the joined structure of the ceramic plate and the copper plate can have issues including lower heat dissipation through the ceramic plate with low heat conductivity, and separation of the edges of the copper plate from the ceramic plate or cracks in the ceramic plate under heat stress at the joint interface between the ceramic plate and the copper plates resulting from the different thermal expansion coefficients of ceramics and copper.

To increase heat dissipation, a power module substrate may include, for example, a ceramic plate formed from a highly conductive ceramic, such as aluminum nitride. However, the ceramic plate formed from aluminum nitride is very expensive. To increase heat dissipation, the power module substrate may include a thinner ceramic plate. However, the thinner ceramic plate formed from an alumina-based ceramic can have a lower strength. A silicon nitride-based ceramic, which has high strength, may be used. However, the ceramic plate formed from silicon nitride is very expensive. To increase heat dissipation, the power module substrate may include a thicker copper plate joined with a ceramic plate. However, the increased heat stress at the joint interface between the ceramic plate and the copper plates resulting from the different thermal expansion coefficients of ceramics and copper may cause separation of the edges of the copper plate and cracks in the ceramic plate. A thin ceramic plate with high heat dissipation made of zirconia added alumina having higher strength than ceramics made of alumina is available recently. This ceramic plate joined with a relatively thick copper plate intends to reduce separation of the edges of the copper plate and to minimize cracks in the ceramic plate under heat stress at the joint interface between the ceramic plate and the copper plate resulting from the different thermal expansion coefficients of ceramics and copper.

The joined structure of the ceramic plate and the copper plates is typically prepared by brazing the copper plates on the two main surfaces of the ceramic plate using an active metal brazing material, or by direct copper bonding (DCB) using heat, which directly bonds the ceramic plate and the copper plates with heat. Brazing using the active metal brazing material allows an active metal brazing material layer, such as a Ag/Cu/Ti layer, to form between the ceramic plate and the copper plates. The brazing layer is expected to serve as a buffer layer against heat stress. However, the active metal brazing material layer can slightly degrade heat dissipation. The DCB using heat is suited for bonding an oxide ceramic plate of, for example, alumina with copper plates. With the DCB using heat, the oxide ceramic plate and the copper plates have their surfaces placed in contact with each other, and are heated to form an eutectic of $Cu$—$Cu_2O$ on their interfaces, and the plates are then cooled for joining. The power module substrate prepared by the DCB using heat includes the copper plates and the ceramic plate joined either directly, or with a very thin copper oxide layer between them, and thus has high heat transfer, or high heat dissipation, at the interfaces between the ceramic plate and the copper plates. However, the ceramic plate or the copper plates still need some measures to reduce stress at the joint interfaces between the ceramic plate and the copper plate edges.

The joined structure of the ceramic plate and the copper plates can have its copper plate surface masked using an etching resist having an intended pattern. The uncovered portions of the copper plate may then be removed by chemical corrosion (etching) to yield the copper circuit plate with an intended shape. The power module substrate is typically obtained from a collective substrate including a plurality of areas to be a plurality of power module substrates, which are then cut along the splitting grooves formed along the boundaries of the power module substrates.

A power module substrate known in the art may have its copper plate with protrusions and recesses on the surface to reduce stress at the joint interface between a ceramic plate and the edges of the copper plate, to position a semiconductor device for soldering, or to prevent overflow of solder (refer to, for example, Patent Literatures 1, 2, and 3).

A method for manufacturing a power module substrate known in the art may form a metal circuit pattern through the three processes: (1) half-etching a metal plate into the shape of a circuit pattern, (2) joining the etched surface with a ceramic plate, and (3) applying an etching resist on the surface of the metal plate that is not joined with the ceramic plate, and half-etching the plate to form a step (refer to, for example, Patent Literature 4). The etching resist film is formed by applying a known ultraviolet curable or thermosetting resist paste onto the metal plate by screen printing, and then curing the paste.

CITATION LIST

Patent Literature

Patent Literature 1: Japanese Unexamined Patent Application Publication No. 4-103150
Patent Literature 2: Japanese Unexamined Patent Application Publication No. 10-242330
Patent Literature 3: Japanese Unexamined Patent Application Publication No. 10-242331
Patent Literature 4: Japanese Unexamined Patent Application Publication No. 2007-134563

However, the power module substrate and the method for manufacturing the power module substrate can have issues described below.

To promptly dissipate heat generated from an electronic component, particularly from a semiconductor device that reaches high temperature, the thickness of the copper plate as a mount for the semiconductor device may be increased to increase the range of heat transfer and diffusion toward the ceramic plate. However, increasing the thickness of the semiconductor device mounting area of the copper plate increases the thickness of the entire island-shaped copper circuit plate. This increases heat stress at the joint interface of the ceramic plate and the copper plate resulting from the different thermal expansion coefficients of ceramics and copper. Although the copper plate with a smaller thickness can reduce heat stress at the joint interface of the ceramic plate and the copper plate, the thinner copper plate disables prompt heat dissipation from the semiconductor device.

The power module substrates described in Japanese Unexamined Patent Application Publication Nos. 4-103150, 10-242330, and 10-242331 each include a copper circuit plate having surface protrusions and recesses, on which a semiconductor device is soldered in a recess, and thus prevent overflow of the solder. However, the portion on which the semiconductor device is mounted has the same thickness as or is thinner than its surrounding portions. Thus, this structure may not promptly dissipate heat generated from the semiconductor device, and may not reduce heat stress at the joint interface between the ceramic plate and the copper plate resulting from the different thermal expansion coefficients of ceramics and copper and may not prevent separation of the copper plate edges from the ceramic plate and cracks in the ceramic plate.

For the power module substrate described for example in Japanese Unexamined Patent Application Publication No. 2007-134563, the copper plate is then half-etched into the shape of an intended circuit pattern before it is joined to the ceramic plate. This may involve misalignment between the copper circuit plate and the ceramic plate. Particularly when individual power module substrates are formed from a large ceramic plate including a plurality of areas to be the substrates, such misalignment can cause relative misalignment of all the copper circuit plates to be joined onto the large ceramic plate. This lowers the yield.

SUMMARY OF INVENTION

One aspect of the present invention provides a substrate for a power module that allows prompt heat dissipation from a semiconductor device, and avoid separation of the edges of a copper plate from a ceramic plate and cracks in the ceramic plate under heat stress at the joint interface of the ceramic plate and the copper plate resulting from the different thermal expansion coefficients of ceramics and copper.

Another aspect of the present invention provides a method for manufacturing a substrate for a power module including a copper circuit plate with precise protrusions and recesses capable of promptly dissipating heat generated from a semiconductor device and reducing heat stress at the joint interface between a ceramic plate and the copper plate resulting from the different thermal expansion coefficients of ceramics and copper.

Another aspect of the present invention provides a method for manufacturing a substrate for a power module for forming a copper circuit plate with precise protrusions and recesses including a portion for preventing overflow of solder when a semiconductor device is joined with solder.

A first aspect of the present invention provides a substrate for a power module including a ceramic plate, a copper circuit plate on a main surface of the ceramic plate, and a heat dissipation copper plate on a surface of the ceramic plate opposite to the main surface. The copper circuit plate includes at least one first copper circuit plate, and at least one second copper circuit plate different from the first copper circuit plate. The first copper circuit plate includes a first portion on which a semiconductor device is mountable, and a second portion having a smaller thickness than the first portion. The second portion is outward from and surrounding the first portion.

A second aspect of the present invention may provide the substrate for a power module according to the first aspect, in which the first copper circuit plate further includes a third portion between the first portion and the second portion, and the third portion has a smaller thickness than the second portion.

A third aspect of the present invention may provide the substrate for a power module according to the first aspect or the second aspect, in which the second copper circuit plate has a smaller thickness than the first portion.

A fourth aspect of the present invention may provide a collective substrate for power modules, in which the collective substrate includes a plurality of the substrates for a power module according to any one of the first to third aspects that are arranged in a matrix and are integral with one another.

A fifth aspect of the present invention provides a method for manufacturing a substrate for a power module. The method includes joining a first large copper plate, and a second large copper plate on two surfaces of a ceramic plate by direct copper bonding using heat or brazing using an active metal brazing material, forming a first etching resist film on each of the first and second large copper plates, etching a portion of each of the first and second large copper plates without the first etching resist film to reduce a thickness of the portion, removing the first etching resist film, forming a second etching resist film on the first large copper plate and a third etching resist film on the second large copper plate, etching a portion of each of the first and second large copper plates without the second etching resist film and the third etching resist film to expose the ceramic plate, removing the second etching resist film, removing the third etching resist film, and forming laser scribe lines for cutting on a surface of the ceramic plate. The second etching resist film is formed with an inkjet method.

The method according to the fifth aspect for manufacturing a substrate for a power module may further include, between the removing the second etching resist film and the removing the third etching resist film, forming a fourth etching resist film with an inkjet method on the first large copper plate from which the second etching resist film has been removed, and etching a portion of the first large copper plate without the fourth etching resist film to reduce a thickness of the portion to be smaller than a thickness of the etched portion of each of the first and second large copper plates without the first etching resist film.

The power module substrate according to the first aspect of the present invention includes the copper circuit plate including the first copper circuit plate and the second copper circuit plate different from the first copper circuit plate. The first copper circuit plate includes the first portion on which a semiconductor device is mountable, and the second portion having a smaller thickness than the first portion. The second portion is outward from and surrounds the first portion. The thickness of the first portion of the copper circuit plate, on which a semiconductor device is mountable, can thus be increased. This structure can increase the range of heat transfer and diffusion from the first portion, and allows heat generated from the semiconductor device to be promptly transferred to the heat dissipation copper plate arranged under the ceramic plate.

Also, the second portion of the copper circuit plate has a smaller thickness than the first portion of the copper circuit plate, and thus can reduce heat stress at the joint interface between the ceramic plate and the copper plate resulting from the different thermal expansion coefficients of ceramics and copper. This structure avoids separation of the edges of the copper circuit plate from the ceramic plate, and cracks in the ceramic plate.

The power module substrate according to the second aspect of the present invention includes the third portion surrounding the first portion. The third portion has a smaller thickness than the second portion. Thus, when a semiconductor device is joined to the first portion with a bond (e.g., solder), the bond that can overflow from the first portion is blocked by the step formed between the second portion and the third portion. This prevents a short circuit between the first copper circuit plate and the second copper circuit plate.

The power module substrate according to the third aspect of the present invention includes the second copper circuit plate having a smaller thickness than the first portion of the copper circuit plate, and thus can reduce heat stress at the joint interface between the ceramic plate and the second copper circuit plate resulting from the different thermal expansion coefficients of ceramics and copper. This structure avoids separation of the edges of the second copper circuit plate from the ceramic plate, and cracks in the ceramic plate.

For the first copper circuit plate having the third portion, the bond that can overflow from the first portion when a semiconductor device is joined to the first portion with a bond is blocked by the step formed between the second portion and the third portion. This prevents a short circuit between the first copper circuit plate and the second copper circuit plate.

The collective substrate for power modules according to the fourth aspect of the present invention includes first portions that are arranged regularly for mounting semiconductor devices. This allows semiconductor devices to be efficiently mounted onto the first portions.

The collective substrate for power modules according to the fourth aspect of the present invention increases the productivity of the final products.

The method for manufacturing a substrate for a power module according to the fifth aspect of the present invention is a method for manufacturing the power module substrate according to the first aspect of the present invention and the power module substrate according to the fourth aspect of the present invention. The method according to the fifth aspect enables manufacture of the power module substrate that promptly dissipates heat generated from the semiconductor device, and reduces heat stress at the joint interface between the ceramic plate and the copper plate resulting from the different thermal expansion coefficients of ceramics and copper to avoid separation of the edges of the copper circuit plate from the ceramic plate and cracks in the ceramic plate in the resultant power module substrate.

The method for manufacturing a substrate for a power module according to the fifth aspect of the present invention uses an inkjet method to form the second etching resist film. The resultant second etching resist film can have a cross-section in correspondence with any protrusions and recesses formed on the large copper plate surface. In other words, the second etching resist film can be formed at intended positions with high accuracy on the large copper plate with surface protrusions and recesses. This method easily forms the second etching resist film without rupture or breaks on any surface protrusions and recesses of the large copper plate. The subsequent etching thus forms precise protrusions and recesses on the large copper plate.

The method for manufacturing a substrate for a power module according to the sixth aspect of the present invention uses an inkjet method to form the fourth etching resist film. The resultant fourth etching resist film can have a cross-section in correspondence with any protrusions and recesses formed on the large copper plate surface. In other words, the fourth etching resist film can be formed at intended positions with high accuracy on the large copper plate with surface protrusions and recesses. The method forms the fourth etching resist film without rupture or breaks on any surface protrusions and recesses of the large copper plate. The subsequent etching thus forms precise protrusions and recesses on the large copper plate.

BRIEF DESCRIPTION OF THE DRAWINGS

FIGS. 6A, 6B, 6C, 6D, 6E, 6F, 6G, 6H, and 6I are diagrams describing a method for manufacturing the power module substrate.

DETAILED DESCRIPTION

A substrate for a power module according to one embodiment of the present invention will now be described with reference to FIGS. 1A and 1B.

Figure 1A:
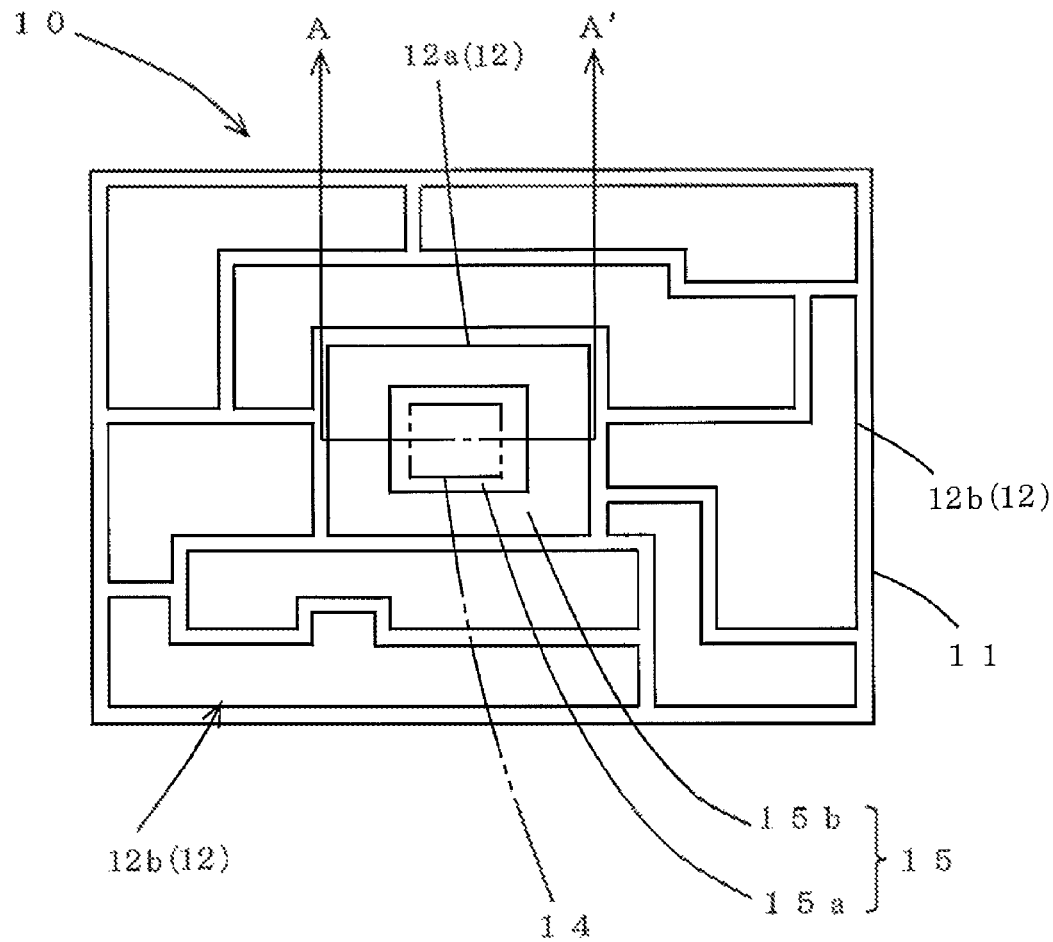
FIG. 1A is a plan view of a power module substrate according to one embodiment of the present invention.
Figure 1B:
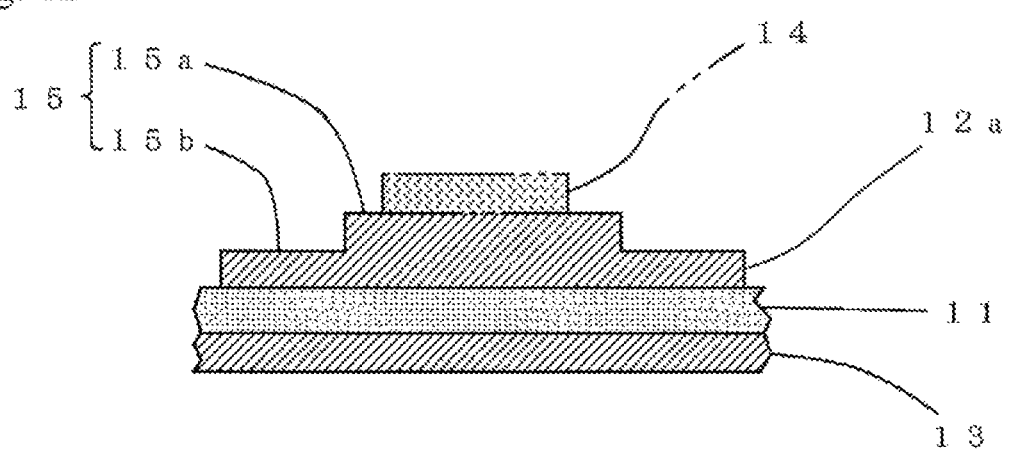
FIG. 1B is an enlarged longitudinal cross-sectional view taken along line A-A' in FIG. 1A.

As shown in FIGS. 1A and 1B, a substrate 10 for a power module according to the present embodiment includes a ceramic plate 11, and an island-shaped copper circuit plate 12, which is joined to one main surface of the ceramic plate 11. The entire copper circuit plate 12 forms an electric circuit. The power module substrate 10 further includes a heat dissipation copper plate 13, which is joined to the other main surface of the ceramic plate 11 to cover the entire surface of the other main surface (where the term entire includes substantially entire). The heat dissipation copper plate 13 dissipates heat generated from an electronic component (e.g., a semiconductor device 14) mounted on the copper circuit plate 12 downward (toward the other main surface).

The copper circuit plate 12 includes a first copper circuit plate 12a for mounting the electronic component, such as the semiconductor device 14, and second copper circuit plates 12b different from the first copper circuit plate 12a.

Although the single first copper circuit plate 12a is arranged on one main surface of the ceramic plate 11 in the present embodiment, two or more first copper circuit plates 12a may be arranged on one main surface of the ceramic plate 11.

Although the multiple second copper circuit plates 12b are arranged on one main surface of the ceramic plate 11 in the present embodiment, a single second copper circuit plate 12b may be arranged on the surface.

Although the semiconductor device 14 is mounted on the first copper circuit plate 12a as one example of an electronic component in FIGS. 1 to 5 for easy understanding of the advantageous effects of the power module substrate according to the present embodiment, the electronic component, such as the semiconductor device 14, may not be an element to be included in the claimed invention.

In use, the power module substrate 10 according to the present embodiment has an electronic component, such as the semiconductor device 14, joined to each of the first copper circuit plates 12a with a bond, such as solder. Typically, a connecting terminal mounted on the upper surface of the semiconductor device 14 is electrically connected to the second copper circuit plate 12b with a bonding wire (not shown), and the second copper circuit plate 12b is electrically connected to an external circuit with a metal lead. The power module substrate 10 according to the present embodiment promptly transfers heat generated from the power semiconductor device 14, such as a power integrated circuit (IC) or an insulated gate bipolar transistor (IGBT), downward through the copper circuit plate 12 to the heat dissipation copper plate 13 (on the other main surface of the ceramic plate 11), and further to a fin heatsink or water cooling heatsink (not shown), which is attached to the heat dissipation copper plate 13. The performance of the device is thus retained.

Figure 2A:
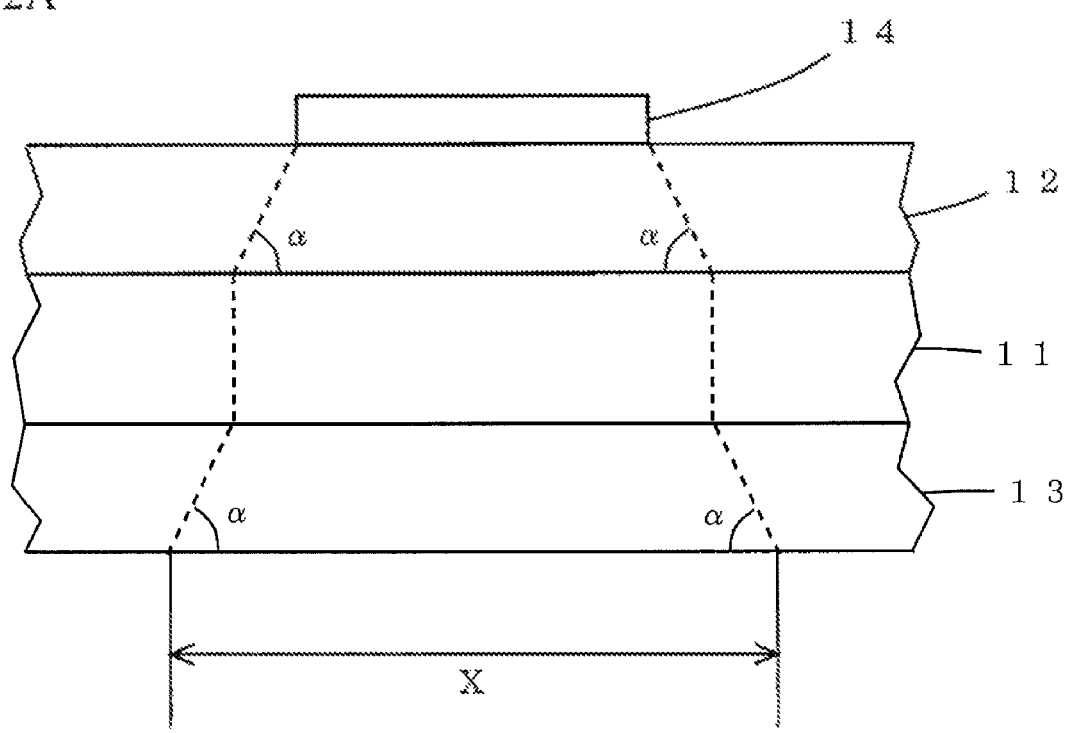
FIGS. 2A and 2B are diagrams describing heat dissipation for power module substrates that differ from each other in the thickness of copper plates.
Figure 2B:
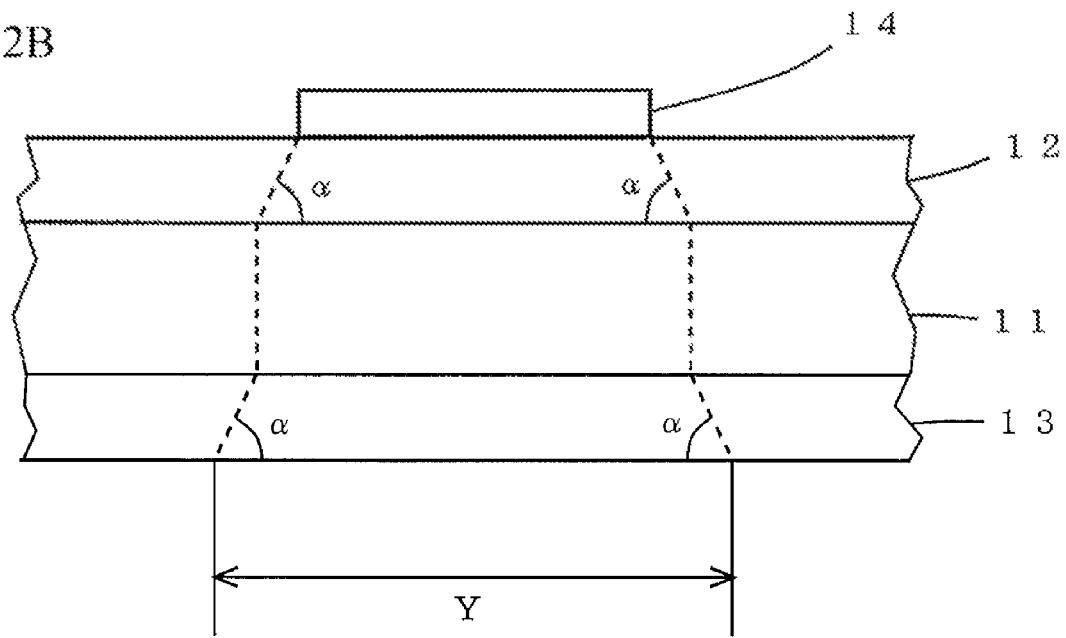

The thickness of the copper plates (the copper circuit plate 12 and the heat dissipation copper plate 13) largely affects any improvement in the heat dissipation of the power module substrate 10. The heat dissipation that can differ depending on the thickness of the copper plates (the first copper circuit plate 12a) will now be described with reference to FIGS. 2A and 2B. Heat generated from the semiconductor device 14 mounted on the copper circuit plate 12 (first copper circuit plate 12a) is promptly transferred from the upper surface toward the lower surface of the copper circuit plate 12, which has high heat conductivity, while spreading downward at a substantially constant angle α. The heat reaching the lower surface of the copper circuit plate 12 is then transferred substantially at right angles from the upper surface toward the lower surface of the ceramic plate 11. Further, the heat reaching the lower surface of the ceramic plate 11 is promptly transferred from the upper surface toward the lower surface of the heat dissipation copper plate 13, which has high heat conductivity, while diverging downward at a substantially constant angle α. The heat reaching the lower surface of the heat dissipation copper plate 13 is then directed outside by air cooling using, for example, heat radiating fins or a heatsink plate (not shown), or by water cooling (not shown) using circulating water along the surface of the heat dissipation copper plate 13. As shown in FIG. 2A, X is the transfer range of heat reaching the lower surface of the heat dissipation copper plate 13 in the structure including a thick copper circuit plate 12 and a thick heat dissipation copper plate 13. As shown in FIG. 2B, Y is the transfer range of heat reaching the lower surface of the heat dissipation copper plate 13 in the structure including a thin copper circuit plate 12 and a thin heat dissipation copper plate 13. In this case, X>Y. The heat dissipation is thus higher as the copper plates (the copper circuit plate 12 and the heat dissipation copper plate 13) are thicker, and is lower as the copper plates (the copper circuit plate 12 and the heat dissipation copper plate 13) are thinner.

In manufacturing the power module substrate 10, the temperature at which the copper circuit plate 12 or the heat dissipation copper plate 13 is joined to the ceramic plate 11 typically reaches 800° C. or higher, or can reach 1000° C. or higher. This temperature is far higher than the temperature at which resin and copper for a plastic circuit substrate are joined together in the process of manufacturing the plastic circuit substrate. The use of a thicker copper circuit plate 12 and a thicker heat dissipation copper plate 13 joined to the ceramic plate 11 to increase heat dissipation in the power module substrate 10 undergoing such manufacturing processes can cause separation of the edges of the copper circuit plate 12 and the heat dissipation copper plate 13 from the ceramic plate 11 or can cause cracks in the ceramic plate 11 under heat stress resulting from the different thermal expansion coefficients of ceramics and copper at the joint interfaces of the ceramic plate 11 and the copper plates (the copper circuit plate 12 and the heat dissipation copper plate 13). When the copper circuit plate 12 and the heat dissipation copper plate 13 are joined to the ceramic plate 11, the copper circuit plate 12 and the heat dissipation copper plate 13 can undergo distortion caused by the different thermal expansion coefficients of ceramics and copper. When such distortion occurs unevenly across the copper circuit plate 12 and the heat dissipation copper plate 13, the power module substrate can warp. To reduce such warpage of the power module substrate, the thicknesses of the copper circuit plate 12 and the heat dissipation copper plate 13 are to be adjusted to allow the copper circuit plate 12 and the heat dissipation copper plate 13 to have substantially the same volume.

The power module substrate 10 according to the present embodiment includes the first copper circuit plate 12a, on which the semiconductor device 14 is to be mounted. The first copper circuit plate 12a has an area 15 including portions with varying thicknesses depending on their use in the copper circuit plate 12.

The area 15 includes a first portion 15a with the largest thickness, and a second portion 15b with a smaller thickness than the first portion 15a. The second portion 15b is outward from the first portion 15a, and surrounds the first portion 15a. In use, the power module substrate 10 according to the present embodiment has an electronic component (e.g., the semiconductor device 14) joined to the thickest first portion 15a with a bond (e.g., solder).

The power module substrate 10 according to the present embodiment allows the semiconductor device 14 to be mounted on the thickest first portion 15a in the first copper circuit plate 12a, and thus can promptly transmit heat generated from the semiconductor device 14 toward the lower surface (toward the other main surface), while increasing the range of heat transfer and diffusion downward at a substantially constant angle α. Further, heat generated from the semiconductor device 14 can be promptly transferred though the heat dissipation copper plate 13 arranged under the ceramic plate 11 toward the lower surface, while increasing the range of heat transfer and diffusion downward at a substantially constant angle α. This allows heat generated from the semiconductor device 14 to be efficiently dissipated outside through a heatsink (not shown) joined to the heat dissipation copper plate 13. In the power module substrate 10 according to the present embodiment, the second portion 15b of the first copper circuit plate 12a has a smaller thickness than the first portion 15a of the first copper circuit plate 12a, and thus can reduce heat stress resulting from the different thermal expansion coefficients of ceramics and copper at the joint interface between the ceramic plate 11 and the second copper circuit plate 12b. This structure avoids separation of the edges of the copper plate 12 from the ceramic plate 11, and cracks in the ceramic plate 11.

To reduce warpage of the power module substrate, the heat dissipation copper plate 13 arranged on the lower surface of the ceramic plate 11 may have a thickness falling between the thickness of the first portion 15a and the thickness of the second portion 15b. Although not particularly limited, the thickness of the second copper circuit plate 12b greater than the thickness of the first portion 15a increases heat stress at the joint interface between the ceramic plate 11 and the second copper circuit plate 12b resulting from the different thermal expansion coefficients of ceramics and copper. The resultant structure may not easily avoid separation of the edges of the second copper circuit plate 12b from the ceramic plate 11 or fracture caused by cracks in the ceramic plate 11.

Although not limiting, the ceramic plate 11 for the power module substrate 10 according to the present embodiment may be formed from an oxide of mainly alumina, such as alumina or alumina-zirconia, or may be formed from silicon nitride or aluminum nitride. These ceramics may not have a purity of 100%, and may contain 5% or less by weight of other components that aids sintering of ceramics, such as silicon, magnesium, or a rare earth element. Although the ceramic plate 11 for the power module substrate 10 typically has a thickness in the range of 0.2 to 1.0 mm, the ceramic plate 11 is to be thinner to increase heat dissipation unless the strength and the insulation of the ceramic plate 11 are degraded. To join the copper circuit plate 12 and the heat dissipation copper plate 13 to the ceramic plate 11 with direct copper bonding (DCB) using heat, an alumina-based oxide ceramic including, for example, alumina or alumina-zirconia, may be used as the ceramic plate 11. As the ceramic plate 11, a nitride ceramic, such as silicon nitride or aluminum nitride containing 5% or less by weight of other components such as silicon, magnesium, or a rare earth element, may also be used. When a nitride ceramic including, for example, silicon nitride or aluminum nitride, is used for the ceramic plate 11 for the power module substrate 10, the copper circuit plate 12 and the heat dissipation copper plate 13 can be joined to the ceramic plate 11 by brazing using an active metal brazing material.

The material for the copper circuit plate 12 and the heat dissipation copper plate 13 for the power module substrate 10 according to the present embodiment may be oxygen-free copper, tough pitch copper, or phosphorus deoxidized copper, which has high electrical conductivity and thermal conductivity, and is inexpensive. The copper circuit plate 12 and the heat dissipation copper plate 13 may contain impurities unless such impurities affect the characteristics of the material microstructure. The permissive amount of impurities, for example, silver or tin, is up to 0.05% by weight. Although the thickness of the copper circuit plate 12 and the heat dissipation copper plate 13 for the power module substrate 10 is typically in the range of 0.2 to 0.6 mm, the thickness may be 1.0 mm or more for use that needs heat dissipation.

When the semiconductor device 14 is joined to the first portion 15a with solder, the molten solder (bond) can overflow from the first portion 15a to the second portion 15b, and further from the second portion 15b to the ceramic plate 11. The flowing solder (bond) may reach an adjacent second copper circuit plate 12b, and cause a short circuit between the copper circuit plate 12a and the copper circuit plate 12b. In response to this, for example, Patent Literature 3 (Japanese Unexamined Patent Application Publication No. 10-242331) describes, as shown in FIGS. 2 and 3 of the literature, a technique for forming a ridge surrounding the semiconductor device on the surface of the copper circuit plate to prevent overflow of the solder. The ridge prevents overflow of solder for joining the semiconductor device to the copper circuit plate. However, this technique includes no consideration for heat dissipation from the semiconductor device. In the structure described in Patent Literature 3, the circuit plate (2) on the lower surface of the semiconductor device has a uniform thickness. Increasing the thickness of the circuit plate (2) to improve heat dissipation would cause the edges of the circuit plate (2) to easily separate from the ceramic substrate (1). In contrast, decreasing the thickness of the circuit plate (2) to prevent separation of the edges of the circuit plate (2) from the ceramic substrate (1) can lower the dissipation of heat generated from the semiconductor device.

Figure 3A:
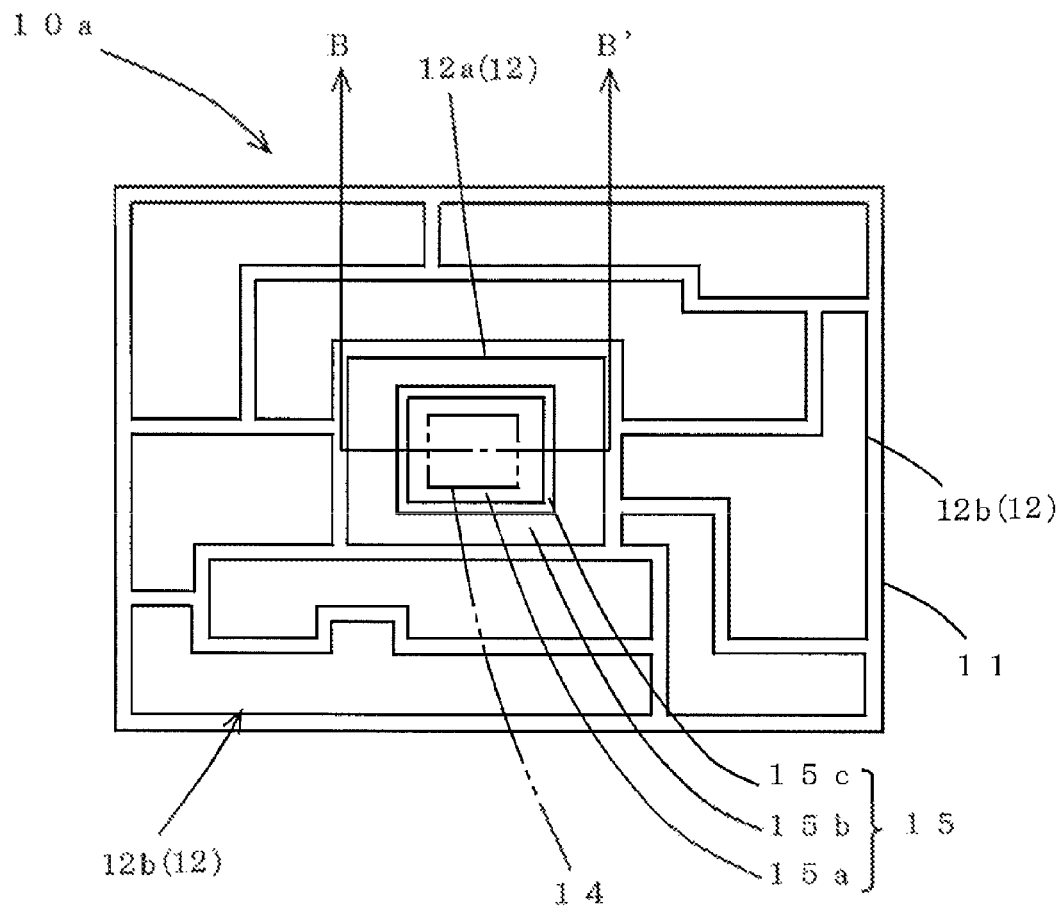
FIG. 3A is a plan view of a power module substrate according to a modification.
Figure 3B:
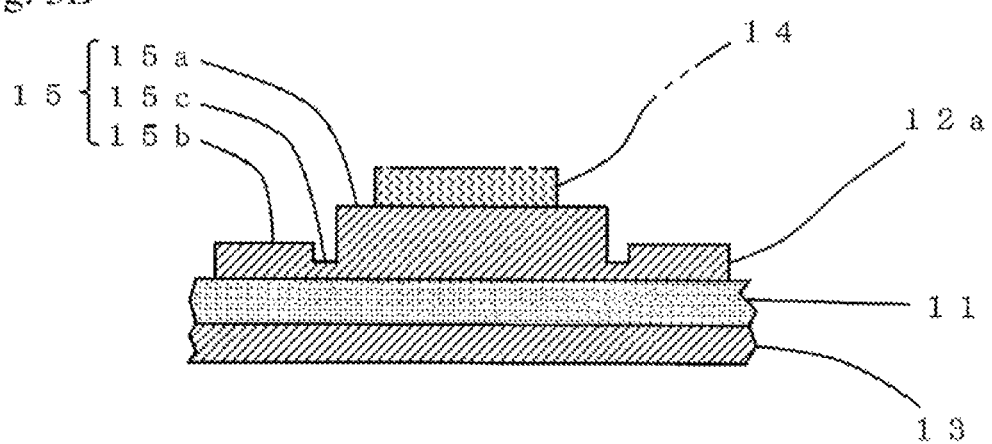
FIG. 3B is an enlarged longitudinal cross-sectional view taken along line B-B' in FIG. 3A.

In response to the above issue, a substrate for a power module according to a modification of the present invention shown in FIGS. 3A and 3B has been developed.

The power module substrate according to the modification of the present invention that can prevent overflow of solder will now be described with reference to FIGS. 3A and 3B.

As shown in FIGS. 3A and 3B, a power module 10a according to the modification of the present invention includes an island-shaped copper circuit plate 12, which includes a first copper circuit plate 12a and a second copper circuit plate 12b on one main surface of the ceramic plate 11, and a heat dissipation copper plate 13 on the other main surface of the ceramic plate 11. In the power module substrate according to the modification of the present invention, the first copper circuit plate 12a, on which a semiconductor device 14 is to be mounted, has an area 15 including portions with varying thicknesses depending on their use. More specifically, as shown in FIGS. 3A and 3B, the area 15 includes a third portion 15c between a first portion 15a and a second portion 15b included in the copper circuit plate 12. The third portion 15c has a smaller thickness than the second portion 15b. In the power module substrate 10a according to the modification of the present invention, the copper circuit plate 12 is thinner in the order of the first portion 15a, the second portion 15b, and the third portion 15c of the area 15. In the same manner as for the power module substrate 10 shown in FIGS. 1A and 1B, the power module substrate 10a shown in FIGS. 3A and 3B may include the second copper circuit plate 12*b* with any thickness. However, the second copper circuit plate 12*b* thicker than the first portion 15*a* increases heat stress at the joint interface between the ceramic plate 11 and the second copper circuit plate 12*b* resulting from the different thermal expansion coefficients of ceramics and copper. This structure may not easily avoid separation of the edges of the second copper circuit plate 12*b* from the ceramic plate 11 and cracks in the ceramic plate 11. Thus, the thickness of the second copper circuit plate 12*b* is to be smaller than the thickness of the first portion 15*a* in the power module substrate 10*a* according to the modification of the present invention as well.

The power module substrate 10*a* according to the modification of the present invention can promptly dissipate heat generated from the semiconductor device 14, and can avoid separation of the edges of the copper circuit plate 12 and the heat dissipation copper plate 13 from the ceramic plate 11 and cracks in the ceramic plate 11. The power module substrate 10*a* according to the modification of the present invention also allows the third portion 15*c* to receive any solder (bond) flowing out of the first portion 15*a*, and prevents the solder from flowing out of the second portion 15*b* when an electronic component, such as a semiconductor device 14, is joined to the first portion 15*a* with solder (bond). This prevents a short circuit between the first copper circuit plate 12*a* and an adjacent second copper circuit plate 12*b*.

Figure 4A:
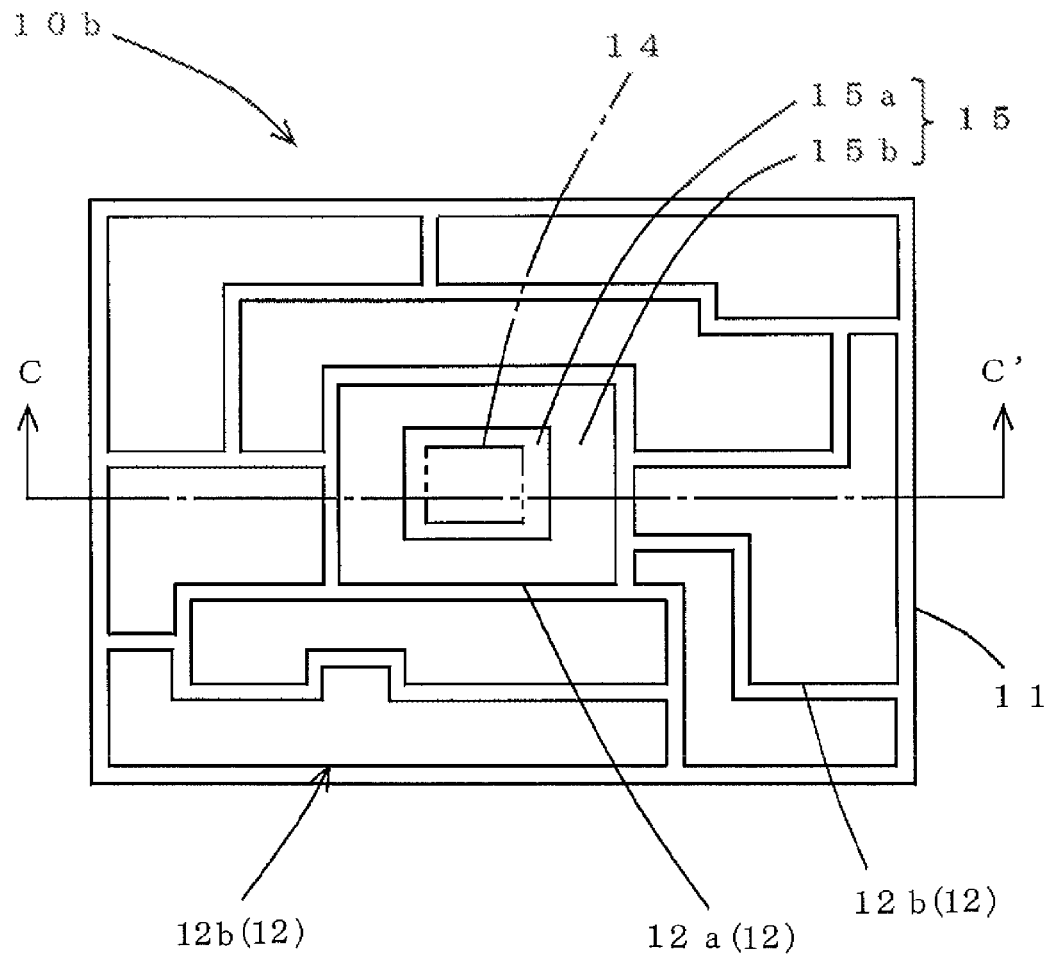
FIG. 4A is a plan view of the power module substrate according to another modification.
Figure 4B:
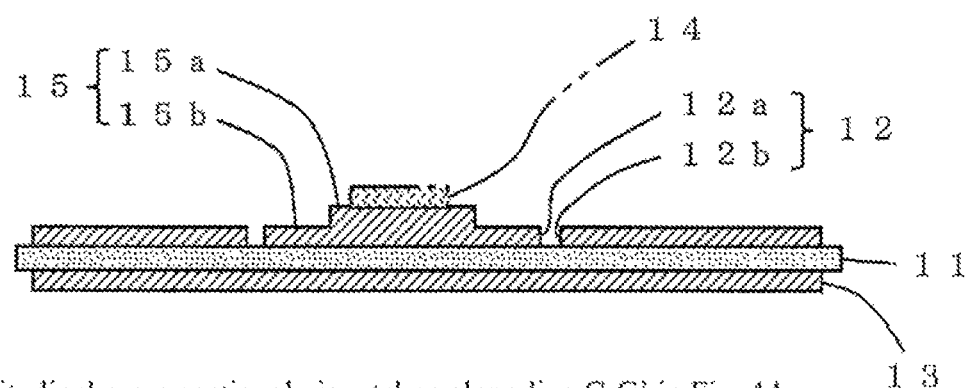
FIG. 4B is a longitudinal cross-sectional view taken along line C-C' in FIG. 4A.

As shown in FIGS. 4A and 4B, the power module substrate 10 according to one embodiment may be modified as a substrate 10*b* for a power module having the second copper circuit plate 12*b* with a smaller thickness than the first portion 15*a*, or with the same thickness (or substantially the same thickness) as the thickness of the second portion 15*b*.

Figure 5A:
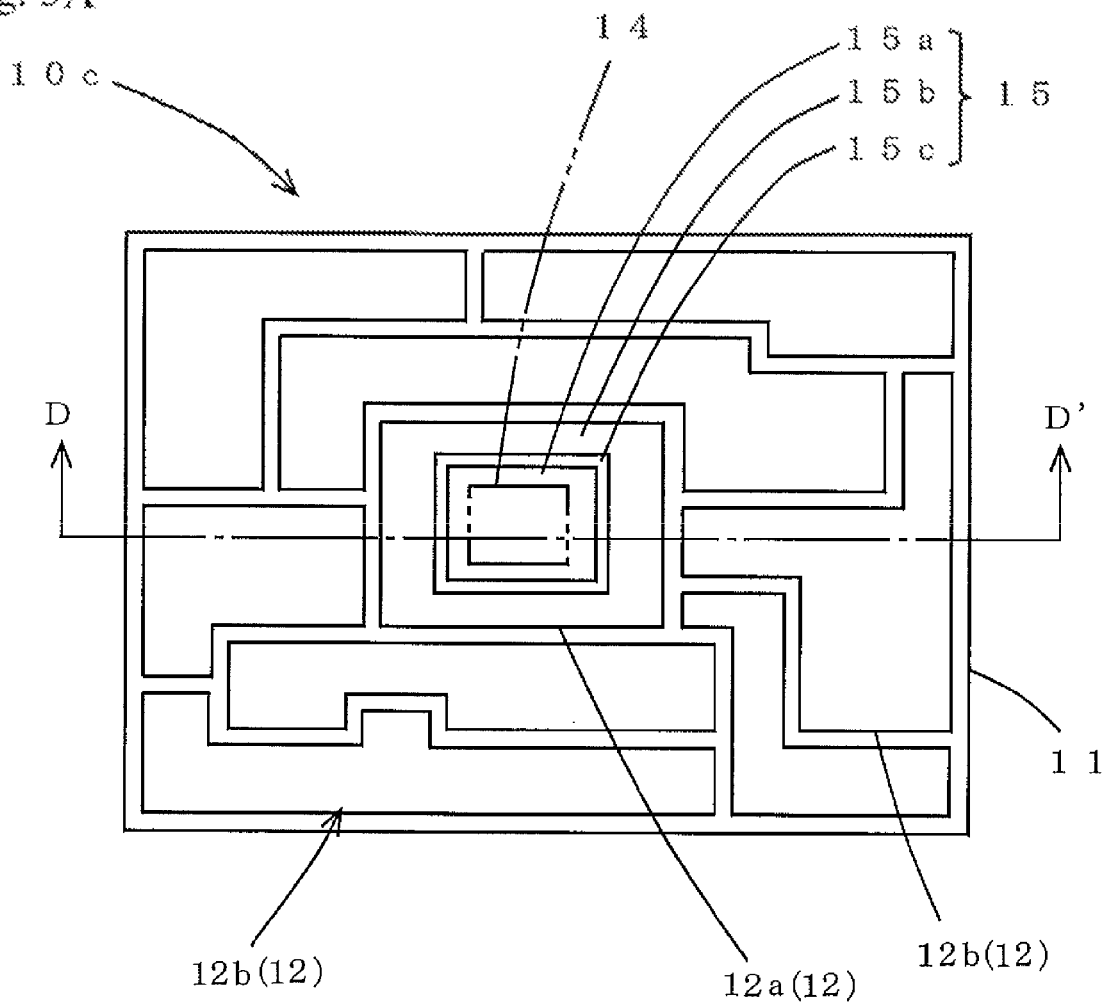
FIG. 5A is a plan view of the power module substrate according to yet another modification.
Figure 5B:
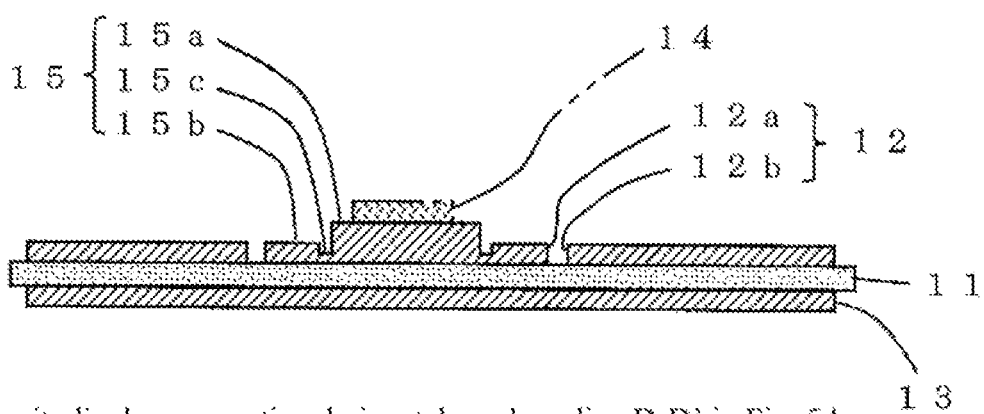
FIG. 5B is a longitudinal cross-sectional view taken along line D-D' in FIG. 5A.

As shown in FIGS. 5A and 5B, the power module 10*a* according to the modification of the present invention may be a substrate 10*c* for a power module having the second copper circuit plate 12*b* with a smaller thickness than the first portion 15*a*, or with the same thickness (or substantially with the same thickness) as the thickness of the second portion 15*b*.

In particular, the power module substrates 10*b* and 10*c* shown in FIGS. 4A to 5B each including the second copper circuit plate 12*b* having the same thickness (or substantially with the same thickness) as the second portion 15*b* can be manufactured with simpler processes (refer to the method for manufacturing the power module substrate according to one embodiment described below), and thus improve productivity.

Further, the power module substrates 10*b* and 10*c* shown in FIGS. 4A to 5B each include the heat dissipation copper plate 13 arranged on the lower surface of the ceramic plate 11. The thickness of the heat dissipation copper plate 13 is determined to optimize the warpage of the power module substrates 10*b* and 10*c*. More specifically, the heat dissipation copper plate 13 has a thickness falling between the thickness of the first portion 15*a* and the thickness of the second portion 15*b* of the first copper circuit plate 12*a*, or a thickness falling between the thickness of the first portion 15*a* and the thickness of the second copper circuit plate 12*b*.

The power module substrates 10*b* and 10*c* shown in FIGS. 4A to 5B can thus promptly transmit heat generated from the semiconductor device 14, which is mounted on the thickest first portion 15*a* in the first copper circuit plate 12*a*, toward the lower surface of the first copper circuit plate 12*a*, while increasing the range of heat transfer and diffusion downward at a substantially constant angle α. This structure further transfers heat generated from the semiconductor device 14 toward the lower surface through the heat dissipation copper plate 13 arranged on the lower surface of the ceramic plate 11, while increasing the range of heat transfer and diffusion downward at the substantially constant angle α. In this manner, the power module substrates 10*b* and 10*c* shown in FIGS. 4A to 5B, which have a long distance locally from the semiconductor device 14 to the ceramic plate 11, can efficiently dissipate heat generated from the semiconductor device 14 outside through a heatsink (not shown).

Additionally, the power module substrates 10*b* and 10*c* shown in FIGS. 4A to 5B have the second portion 15*b* and the second copper circuit plate 12*b* both having smaller thicknesses than the first portion 15*a*. This structure reduces heat stress at the joint interface between the ceramic plate 11 and the second copper circuit plate 12*b*, and at the joint interface between the ceramic plate 11 and the heat dissipation copper plate 13 resulting from the different thermal expansion coefficients of ceramics and copper, and can avoid separation of the edges of each copper circuit plate 12 and the edges of the heat dissipation copper plate 13 from the ceramic plate 11, and cracks in the ceramic plate 11.

In the power module substrates 10 and 10*a* to 10*c* according to one embodiment shown in FIGS. 1A and 1B, and FIGS. 3A to 5B, if the second portion 15*b*, the third portion 15*c*, and the second copper circuit plate 12*b* have a smaller thickness than the first portion 15*a*, the second portion 15*b*, the third portion 15*c*, and the second copper circuit plate 12*b* each may not have a uniform thickness.

Although each of the power module substrates 10 and 10*a* to 10*c* according to one embodiment is provided as an individual piece as shown in FIGS. 1A, 3A, 4A and 5A, a plurality of such substrates may be integrated into a collective substrate in which a plurality of power module substrates 10, 10*a*, 10*b*, or 10*c* are arranged in a matrix.

The collective substrate for power modules includes the first portions 15*a* in each of which the semiconductor device 14 is to be mounted. The first portions 15*a* are arranged regularly on the ceramic plate 11. The semiconductor devices 14 can thus be efficiently mounted on the respective first portions 15*a*.

The collective substrate for power modules thus increases the productivity of the final products, which may be electronics devices for household use or business use, such as air conditioners, electronics devices for controlling, for example, robots and elevators, and electronics devices used in, for example, automobiles and trains.

A method for manufacturing the power module substrate 10*b* according to one embodiment shown in FIGS. 4A and 4B described above will now be described with reference to FIGS. 6A to 6I. More specifically, the method for manufacturing the power module substrate including the area 15 (the first copper circuit plate 12*a*) without the third portion 15*c* between the first portion 15*a* and the second portion 15*b* will now be described with reference to FIGS. 6A to 6I.

The method for manufacturing the power module substrates 10, 10*a*, 10*b*, or 10*c* according to one embodiment, each of which includes the island-shaped copper circuit plate 12 arranged on one main surface of the ceramic plate 11 and the heat dissipation copper plate 13 arranged on the other main surface, is typically classified into two methods: a method for manufacturing a power module substrate 10, 10*a*, 10*b*, or 10*c* as an individual piece; and a method for preparing a collective substrate for power modules including a large ceramic plate 11 on which a plurality of individual power module substrates 10, 10a, 10b, or 10c are arranged, and then cutting the collective substrate into individual pieces.

The manufacturing method using the large ceramic plate (the latter method) will now be described.

The method for manufacturing the power module substrate according to the present embodiment mainly includes preparing a large ceramic plate (first process shown in FIG. 6A), joining a large copper plate to each of the two main surfaces of the large ceramic plate (first process shown in FIG. 6A), preparing a collective substrate for power modules by forming a pattern to be a copper circuit plate 12 and a heat dissipation copper plate 13 (second to fifth processes shown in FIGS. 6B to 6I), and optionally cutting the collective substrate for power modules into individual power module substrates 10, 10a, 10b, or 10c (not shown).

In the first process, as shown in FIG. 6A, a flat large ceramic plate 21 including a plurality of ceramic plates 11 for individual power module substrates 10b is prepared. The large ceramic plate 21 is prepared by cutting a ceramic green sheet into a quadrangle with an intended size, and firing the cut piece of the ceramic green sheet. An oxide ceramic green sheet is fired at a high temperature of 1500° C. or higher in an atmosphere. A nitride ceramic green sheet is fired at a high temperature of 1600° C. or higher in a nitrogen atmosphere.

A flat large copper plate 22, which is to be a copper circuit plate 12, is joined to one main surface of the fired large ceramic plate 21, and a flat large copper plate 23, which is to be a heat dissipation copper plate 13, is joined to the other main surface of the large ceramic plate 21, both by the DCB using heat (when the large ceramic plate 21 is formed from an oxide ceramic) or by brazing using an active metal brazing material (when the large ceramic plate 21 is formed from a material other than an oxide ceramic).

The DCB using heat is direct bonding achieved by arranging a large copper plate 22 on one main surface of the large ceramic plate 21 and a large copper plate 23 on the other main surface of the large ceramic plate 21, maintaining the facing surfaces between the plates in contact, and heating the structure at a temperature of 1065 to 1083° C. (the melting point of copper) to form an eutectic of Cu—$Cu_2O$ on the interface between the large ceramic plate 21 and the large copper plate 22, and also on the interface between the large ceramic plate 21 and the large copper plate 23, and then cooling the structure to join the large copper plates 22 and 23 directly onto the large ceramic plate 21 without a bond.

The brazing using an active metal brazing material is liquid phase bonding achieved by arranging a brazing filler metal (e.g., a Ag—Cu alloy containing an activated metal, such as Ti or Zr, and having a lower melting point than copper) between one main surface of the large ceramic plate 21 and the large copper plate 22, and between the other main surface of the large ceramic plate 21 and the large copper plate, and then heating the structure at a temperature of about 800° C. to allow liquid-phase bonding of the large ceramic plate 21 and the large copper plates 22 and 23.

Although the large copper plate 22 for the copper circuit plate 12 and the large copper plate 23 for the heat dissipation copper plate 13 may have any thicknesses, the large copper plate 23 for the heat dissipation copper plate 13 may have the thickness approximate to the second portion 15b as described below.

In the subsequent second process, as shown in FIG. 6B, a first etching resist film 25 is formed in the area to be the first portion 15a, on which the semiconductor device 14 is to be mounted, on the large copper plate 22. A first etching resist film 25a is formed to cover the entire surface of the large copper plate 23, which is to be the heat dissipation copper plate 13. The first etching resist films 25 and 25a may be formed with any method. For example, the first etching resist films 25 and 25a may be formed by the inkjet method or other methods described below.

With the inkjet method, ink containing a photoresist solution is directly ejected and applied onto the large copper plates 22 and 23, and the applied ink is photocured to form the first etching resist films 25 and 25a.

The first etching resist films 25 and 25a may be formed with methods other than the inkjet method including, for example, applying a photoresist paste onto the large copper plates 22 and 23 by screen printing, and photocuring the printed photoresist paste. Other methods include a dry film method implemented by attaching a photoresist dry film on the large copper plates 22 and 23, placing a pattern mask in contact with the dry film, photocuring the patterned portion exposed from the mask, then removing the pattern mask, and removing the dry film uncured portion to form the pattern at intended positions. Further, the first etching resist films 25 and 25a may be formed at intended positions of the large copper plates 22 and 23 by directly applying a photoresist solution, in place of the dry film, onto the top surfaces of the large copper plates 22 and 23 using, for example, a roll coater, or immersing a joined structure 24 into the photoresist solution to form the first etching resist films 25 and 25a on the large copper plates 22 and 23, then drying the films and placing a pattern mask in contact with the dried films (the first etching resist films 25 and 25a), photocuring the patterned portion exposed from the pattern mask, then removing the pattern mask, and removing uncured portions of the dried films.

In the third process, as shown in FIG. 6C, the portion exposed from the first etching resist films 25 and 25a of the large copper plate 22 is etched to have a thickness smaller than the thickness of the first portion 15a, for example, to half (or substantially half) the thickness of the first portion 15a. The etching is performed by corroding and removing the large copper plate 22 using an acid etching solution (e.g., ferric chloride ($FeCl_3$) or copper chloride ($CuCl_2$)) or an alkaline etching solution (e.g., a solution as a mixture of copper oxide (CuO) and ammonium chloride ($NH_4Cl$)). In the third process, as shown in FIG. 6D, the first etching resist films 25 and 25a are then removed by stripping them off from the large copper plates 22 and 23 using, for example, sodium hydroxide.

Although the second copper circuit plate 12b has the same thickness as the second portion 15b in the present embodiment, the second copper circuit plate 12b may not have the same thickness as the first portion 15a or as the second portion 15b. Further, the surface of the etched area of the copper plate may not be flat, but all the etched areas of the copper plate (the large copper plate 22) have at least a smaller thickness than the non-etched areas of the copper plate (the large copper plate 22).

Subsequently, as shown in FIG. 6E, a second etching resist film 25b is formed in the area to be the copper circuit plate 12 on the large copper plate 22 by the inkjet method using ink containing a photoresist solution. Although a third etching resist film 25c is also formed in the area to be the heat dissipation copper plate 13 on the large copper plate 23 at the same time, the third etching resist film 25c may not be formed particularly by the inkjet method, and may be formed by other methods as described above.

As shown in FIG. 6F, the large copper plates 22 and 23 exposed from the second and third etching resist films 25b and 25c are etched with the same method as described above to expose the surfaces of the intended portions of the large ceramic plate 21 to define the outer shapes of the copper circuit plate 12 and the heat dissipation copper plate 13 in the resultant individual power module substrates.

With the inkjet method, the photoresist ink is directly ejected onto the surfaces of the copper plates (the large copper plates 22 and 23) to form a pattern. Thus, the pattern can be precisely formed on the surfaces of the copper plates that may not be flat, unlike other methods. In other words, the inkjet method is usable for objects with surfaces that are not flat. The inkjet method thus allows the second etching resist film 25b to adhere, with high positional accuracy, at intended positions of the large copper plate 22 with surface protrusions and recesses. This can prevent the etching solution from entering the interface between the large copper plate 22 and the etching resist film that adheres to the film, and allows the copper circuit plate 12 to form in an accurate shape. The first and third etching resist films 25, 25a, and 25c are formed on the flat large copper plates 22 and 23, and thus may not use the inkjet method.

In the fifth process, as shown in FIG. 6G, the second and third etching resist films 25b and 25c are removed from the top surfaces of a plurality of sets of copper circuit plates 12 and a plurality of sets of heat dissipation copper plates 13 to form a collective substrate 26 for power modules including a plurality of individual power module substrates 10b is arranged into a collective structure.

In the fifth process, as shown in FIG. 6H, laser scribe lines 27 are formed on the large ceramic plate 21. The laser scribe lines 27 are used to cut the collective substrate 26 for power modules into individual power module substrates 10b.

The collective substrate 26 for power modules having the laser scribe lines 27 may be shipped as a completed product. The collective substrate 26 for power modules with such laser scribe lines 27 includes the first portions 15a that are regularly arranged on the large ceramic plate 21, and thus allows the semiconductor devices 14 to be efficiently mounted on the first portions 15a. The collective substrate 26 for power modules thus increases the productivity of the final products. When the method for manufacturing the power module substrate according to the present embodiment is completed after the process for forming the collective substrate 26 for power modules having the laser scribe lines 27, the process for cutting the collective substrate 26 for power modules into individual pieces will be performed after the semiconductor devices 14 are mounted on the first portions 15.

The collective substrate 26 for power modules is then cut along the laser scribe lines 27 into individual pieces to easily yield individual power module substrates 10b. The laser scribe lines 27 can be easily formed using, for example, a typical yttrium aluminum garnet (YAG) laser or a $CO_2$ laser.

The method for manufacturing the power module substrate 10b according to the present embodiment allows formation of the copper circuit plate 12 with precise surface protrusions and recesses. This structure allows heat generated from the semiconductor device 14 mounted on thick areas (first portion 15a) in the copper circuit plate 12 to be promptly dissipated outside. The method for manufacturing the power module substrate according to the present embodiment further allows the copper circuit plate 12 in the power module substrate 10b to have relatively thinner portions (the second portion 15b, the third portion 15c, the second copper circuit plate 12b, and the heat dissipation copper plate 13) other than the portion on which the semiconductor device 14 is mounted. This structure can avoid separation of the edges of the copper circuit plate 12 and the heat dissipation copper plate 13 from the ceramic plate 11, and cracks in the ceramic plate 11 under heat stress at the joint interface between the ceramic plate 11 and the copper circuit plate 12, and at the joint interface between the ceramic plate 11 and the heat dissipation copper plate 13 resulting from the different thermal expansion coefficients of ceramics and copper.

Of the power module substrates 10, 10a, 10b, and 10c according to one embodiment, the method for manufacturing the power module substrate 10c (refer to FIGS. 5A and 5B), which includes the first copper circuit plate 12a having the third portion 15c arranged between the first portion 15a and the second portion 15b, will now be described with reference to FIGS. 7A to 7D. The method for manufacturing the power module 10c according to the modification of the present invention includes the same first to fourth processes (from FIGS. 6A to 6F) as the processes included in the method for manufacturing the power module substrate 10b.

With the method for manufacturing the power module according to the modification of the present invention, the second etching resist film 25b is removed from the joined structure 24 that has undergone the fourth process shown in FIG. 6F.

Figure 7A:
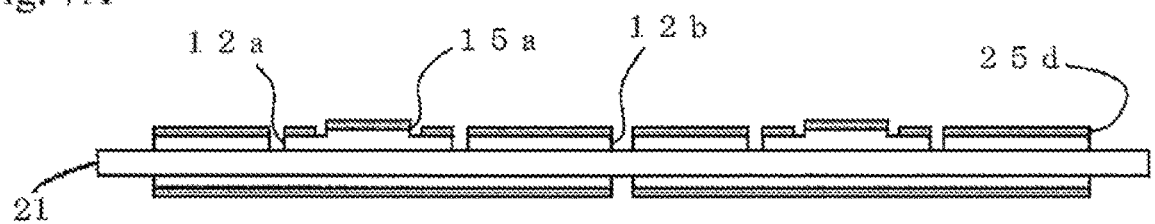
FIGS. 7A, 7B, 7C, and 7D are diagrams describing a method for manufacturing the power module substrate according to a modification.

In the subsequent process shown in FIG. 7A, a fourth etching resist film 25d is formed by the inkjet method on each of the first and second copper circuit plates 12a and 12b, which are formed from the large copper plate 22. The fourth etching resist film 25d has an opening, or a groove surrounding the first portion 15a of the first copper circuit plate 12a, and covers the entire surface of the first copper circuit plate 12a except the opening.

The fourth etching resist film 25d further covers the entire surface of the second copper circuit plate 12b. Although not shown in FIG. 7B, the fourth etching resist film 25d is formed on the side surfaces defining the first portion 15a of the first copper circuit plate 12a, the side surfaces defining the second portion 15b, and the side surfaces defining the second copper circuit plate 12b. In other words, in the process shown in FIG. 7A, the fourth etching resist film 25d is not formed only at positions where the third portions 15c are to be formed on the upper surface of the first copper circuit plate 12a, and the fourth etching resist film 25d is formed on all the remaining other surfaces of the first copper circuit plate 12a (the upper surface and the side surfaces).

Figure 7B:
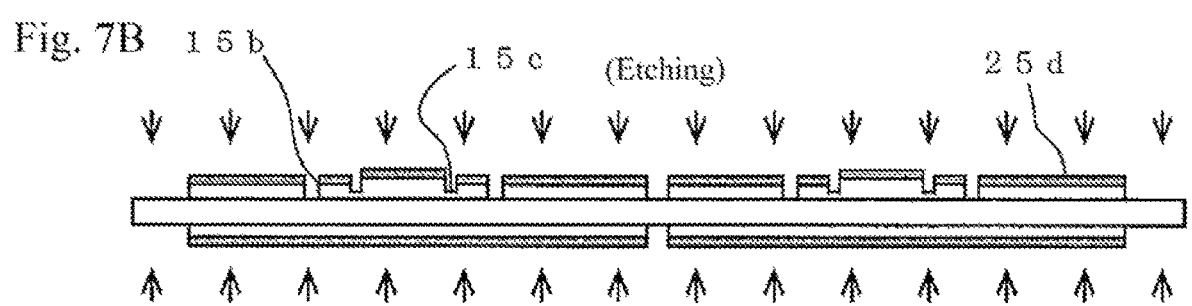

As shown in FIG. 7B, the surface of the first copper circuit plate 12a exposed from the opening of the fourth etching resist film 25d is etched to form the third portion 15c, which has a smaller thickness than the second portion 15b. The fourth etching resist film 25d and the third etching resist film 25c are then removed. The inkjet method, with which a pattern is formed by directly ejecting photoresist ink onto the surface of the copper plate to be the copper circuit plate 12, is usable to form a pattern with high positional accuracy on the surface of the copper plate to be the copper circuit plate 12 that may not be flat, unlike the other methods described above. Thus, the fourth etching resist film 25d can adhere at intended positions of the surface of the copper plate to be the copper circuit plate 12, or more specifically, onto the upper surface of the first copper circuit plate 12a with protrusions and recesses, the side surfaces defining the first copper circuit plate 12a, and the side surfaces defining the second copper circuit plate 12b. This can prevent the etching solution from entering the interface between the fourth etching resist film 25d and the first copper circuit plate 12a, to which the fourth etching resist film 25d adheres. This enables accurate formation of the first copper circuit plate 12a with an intended shape. Thus, the method for manufacturing the power module substrate according to the modification of the present invention (the method for manufacturing the power module substrate 10c) can form the power module substrate 10c including the first copper circuit plate 12a with precise protrusions and recesses, and the third portion 15c to receive solder that can overflow from the first portion 15a when the semiconductor device 14 is mounted onto the first portion 15a.

Figure 7C:
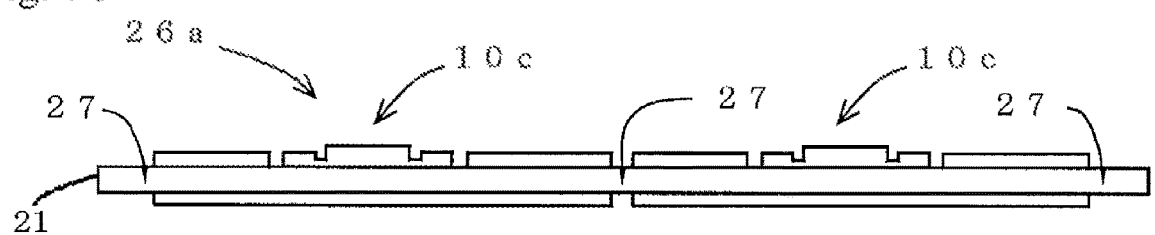
Figure 7D:
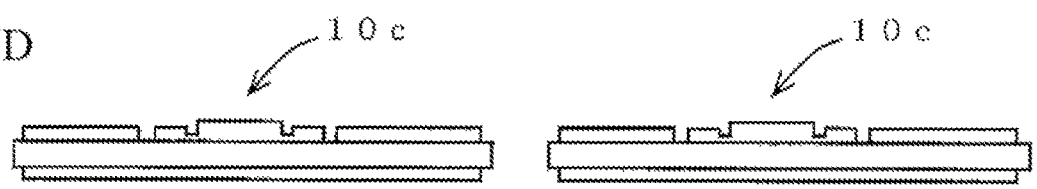

As shown in FIG. 7C, the method for manufacturing the power module according to the modification of the present invention (the method for manufacturing the power module substrate 10c) includes forming laser scribe lines 27 on the large ceramic plate 21 to be used to cut individual power module substrates 10b from the power module collective substrate 26a, in the same manner as the method described above for manufacturing the power module substrate 10b. As shown in FIG. 7D, cutting the collective substrate along the laser scribe lines 27 on the large ceramic substrate 21 easily yields the individual power module substrates 10c.

The power module collective substrate 26a having the laser scribe lines 27 shown in FIG. 7C may be shipped as a completed product. The power module collective substrate 26a with such laser scribe lines 27 includes the first portions 15a that are regularly arranged on the large ceramic plate 21, and allows the semiconductor devices 14 to be efficiently mounted on the first portions 15a. The power module collective substrate 26a having the laser scribe lines 27 increases the productivity of the final products.

In this case, the process for cutting the power module collective substrate 26a into individual pieces will be performed after the semiconductor devices 14 are mounted on the first portions 15a.

INDUSTRIAL APPLICABILITY

The power module substrate and the power module collective substrate, and the method for manufacturing the power module substrate according to one embodiment are used for devices that can suddenly receive high voltage and can promptly dissipate heat generated from the devices to maintain high reliability. Examples of such devices include electronics devices for household use or business use, such as air conditioners, electronics devices for controlling, for example, robots and elevators, and electronics devices used in, for example, automobiles and trains.

REFERENCE SIGNS LIST 10 power module substrate
10a power module substrate
10b power module substrate
10c power module substrate
11 ceramic plate
12 copper circuit plate
12a first copper circuit plate
12b second copper circuit plate
13 heat dissipation copper plate
14 semiconductor device
15 area
15a first portion
15b second portion
15c third portion
21 large ceramic plate
22 large copper plate
23 large copper plate
24 joined structure
25 first etching resist film
25a first etching resist film
25b second etching resist film
25c third etching resist film
25d fourth etching resist film
26 power module collective substrate
26a power module collective substrate
27 laser scribe line

The invention claimed is:

1. A substrate for a power module, comprising:
a ceramic plate;
a copper circuit plate on a main surface of the ceramic plate; and
a heat dissipation copper plate on a surface of the ceramic plate opposite to the main surface,
the copper circuit plate including
at least one first copper circuit plate, and
at least one second copper circuit plate different from the first copper circuit plate,
the first copper circuit plate including a first portion on which a semiconductor device is mountable, and a second portion having a smaller thickness than the first portion, the second portion being outward from the first portion, and a third portion between the first portion and the second portion, the third portion having a smaller thickness than the second portion,
wherein the third portion completely surrounds the first portion and the second portion completely surrounds the third portion.

2. The substrate for a power module according to claim 1, wherein
the second copper circuit plate has a smaller thickness than the first portion.

3. A collective substrate for power modules, comprising:
a plurality of the substrates for a power module according to claim 1, wherein the plurality of the substrates are arranged in a matrix and are integral with one another.

4. A collective substrate for power modules, comprising:
a plurality of the substrates for a power module according to claim 2, wherein the plurality of the substrates are arranged in a matrix and are integral with one another.

* * * * *